United States Patent [19]
Wuu et al.

[11] Patent Number: 5,867,087
[45] Date of Patent: Feb. 2, 1999

[54] THREE DIMENSIONAL POLYSILICON RESISTOR FOR INTEGRATED CIRCUITS

[75] Inventors: Shou-Gwo Wuu; Mong-Song Liang; Chen-Jong Wang; Chung-Hui Su, all of Hsin-Chu, Taiwan

[73] Assignee: Taiwan Semiconductor Manufacturing Company, Ltd., Hsin-Chu, Taiwan

[21] Appl. No.: 791,119

[22] Filed: Jan. 30, 1997

Related U.S. Application Data

[63] Continuation of Ser. No. 518,701, Aug. 24, 1995, abandoned.

[51] Int. Cl.[6] .................................................. H01C 1/012
[52] U.S. Cl. ........................ 338/311; 338/310; 338/252; 338/312; 29/610.1; 29/620; 257/538
[58] Field of Search .......................... 257/538; 438/430; 148/DIG. 136; 538/310, 311, 314, 312, 306, 308, 334, 320, 204, 260, 252; 29/610.1, 620

[56] References Cited

U.S. PATENT DOCUMENTS

| | | |
|---|---|---|
| 4,406,051 | 9/1983 | Iizuka ............................ 148/DIG. 136 |
| 4,690,728 | 9/1987 | Tsang et al. .......................... 156/643.1 |
| 4,968,645 | 11/1990 | Baldi et al. .............................. 437/918 |
| 5,037,766 | 8/1991 | Wang ....................................... 437/918 |
| 5,141,597 | 8/1992 | Adams et al. . |
| 5,177,030 | 1/1993 | Lee et al. ................................. 437/918 |
| 5,268,325 | 12/1993 | Spinner, III ............................. 437/918 |
| 5,316,978 | 5/1994 | Boyd et al. .............................. 437/918 |
| 5,403,768 | 4/1995 | Jeong et al. ............................. 437/918 |
| 5,451,809 | 9/1995 | Shiozawa et al. ....................... 257/538 |
| 5,461,000 | 10/1995 | Liang ...................................... 437/918 |
| 5,514,617 | 5/1996 | Liu .......................................... 437/918 |
| 5,521,117 | 5/1996 | Kapoor .................................... 437/918 |
| 5,602,408 | 2/1997 | Watanabe et al. ...................... 257/538 |
| 5,672,537 | 9/1997 | Carl et al. ............................... 438/430 |

Primary Examiner—Renee S. Luebke
Assistant Examiner—Karl Easthom
Attorney, Agent, or Firm—George O. Saile; Stephen B. Ackerman; Alek P. Szecsy

[57] ABSTRACT

A three dimensional polysilicon resistor and a method by which the three dimensional polysilicon resistor is manufactured. A semiconductor substrate has formed upon its surface an insulating layer. The insulating layer has a minimum of one aperture formed at least partially through the insulating layer. A polysilicon layer is formed upon the insulating layer and formed conformally into the aperture(s) within the insulating layer. The polysilicon layer is then patterned to form a resistor which includes the portion of the polysilicon layer which resides within the aperture(s).

15 Claims, 3 Drawing Sheets

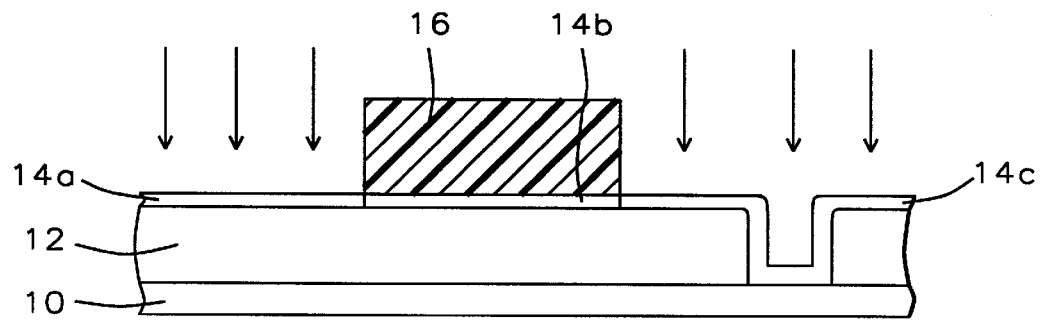
FIG. 1 - Prior Art
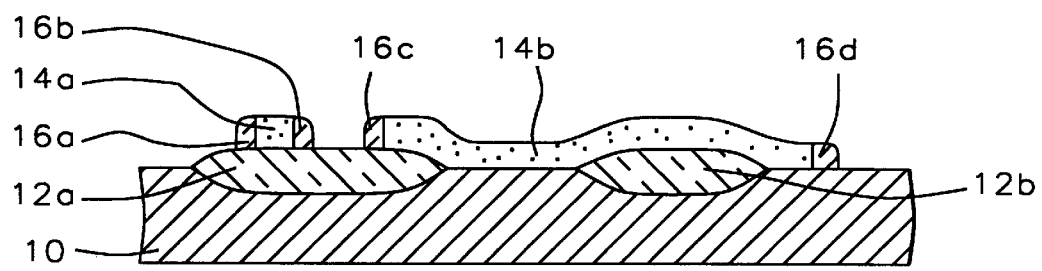
FIG. 2a
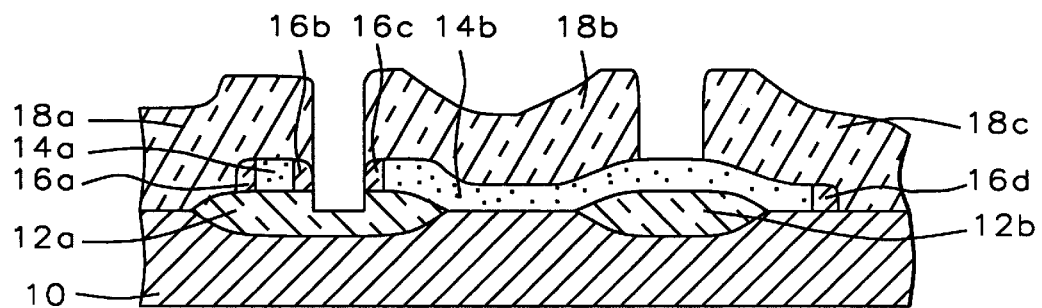
FIG. 2b

THREE DIMENSIONAL POLYSILICON RESISTOR FOR INTEGRATED CIRCUITS

CROSS REFERENCE TO RELATED APPLICATION

This application is a continuation of application Ser. No. 08/518,701, filed 24 Aug. 1995, now abandoned.

BACKGROUND OF THE INVENTION

1. Field of the Invention

The present invention relates generally to resistors formed within and upon semiconductor integrated circuit substrates. More particularly, the present invention relates to a three dimensional polysilicon resistor for use within advanced semiconductor integrated circuit device cells of limited dimension.

2. Description of Related Art

In addition to the use of transistors and diodes as switching elements and current rectifying devices in semiconductor integrated circuits, it is also quite common in the art that those circuits will have resistors incorporated into their designs and fabrications. Commonly, a resistor structure within an integrated circuit will provide an electrical load which assures proper operation of the circuit under the electrical current and voltage parameters to which the circuit was designed.

There are several methods and materials through which resistors may be designed and fabricated into semiconductor integrated circuits. A common traditional method is to fabricate resistors within the silicon semiconductor substrate of an integrated circuit device. Resistors of varying resistance can easily be fabricated within such semiconductor substrates by means of doping the semiconductor substrate through an ion implantation process similar to the ion implantation process used in forming other active semiconductor regions within the same semiconductor substrate. The practice of forming resistors through implanting dopant ions into semiconductor substrates is a viable technique unless resistors are required whose resistance exceeds the resistance of the semiconductor substrate within which the resistor is desired to be fabricated.

An alternate method which provides resistors of greater or equal resistance to resistors formed within semiconductor substrates is to form resistors from discrete portions of a high resistivity material which is deposited upon the surface of the lower resistivity semiconductor substrate. A common high resistivity material which is useful in forming these higher resistance resistors is undoped or lightly doped polysilicon. While it is known in the art that highly doped polysilicon is an excellent conductor from which conductive structures within integrated circuit devices may be fabricated, it is also well known that undoped or lightly doped polysilicon is a highly resistive material.

When formed from a high resistivity material such as undoped or lightly doped polysilicon, the resistance of a resistor may be determined from straightforward considerations. Specifically, the resistance of the polysilicon resistor is nominally directly related to the length of the polysilicon layer from which the resistor is formed and nominally inversely related to the cross-sectional area of the polysilicon layer from which the resistor is formed. For polysilicon resistors formed via planar thin film polysilicon processes within integrated circuits, the resistance of the polysilicon resistor is in nominally inversely related to the thickness and the width of the polysilicon layer from which the resistor is formed.

A cross-sectional diagram of a typical polysilicon resistor formed within an integrated circuit is shown in FIG. 1. Within FIG. 1, there is shown a semiconductor substrate 10 upon which there is formed an insulating layer 12. Upon the insulating layer 12 is formed a polysilicon layer which is comprised of polysilicon layers 14a, 14b and 14c. The polysilicon layer 14b which resides beneath a patterned photoresist layer 16 forms a polysilicon resistor. The polysilicon layers 14a and 14c are typically subsequently heavily doped through the process of ion implantation to form conductive doped polysilicon ends to the polysilicon resistor which is formed from the polysilicon layer 14b.

As semiconductor technology has advanced, conflicting trends have evolved which require resistors of increased resistance while simultaneously providing diminished semiconductor substrate surface area upon which those resistors may be fabricated. In addition, the thickness of undoped or lightly doped polysilicon layers from which are formed high resistance resistors in integrated circuit devices is nearing the limits with which current semiconductor equipment may efficiently and reproducibly deposit those layers.

Thus, the problem to which the present invention is directed is defining a more efficient high resistance undoped or lightly doped polysilicon resistor structure and its method of fabrication within semiconductor integrated circuits. The desired high resistance polysilicon resistor structure will provide a resistor of sufficiently limited surface area to efficiently use substrate surface area available to the resistor.

The desired method by which the high resistance polysilicon resistor is formed will not unduly challenge established semiconductor manufacturing processes and process limitations.

Not disclosed within the art are methods by which polysilicon resistors may be fabricated within semiconductor integrated circuits, which resistors have substantially increased resistance in comparison with equivalent resistors of the same dimension. Nor is there disclosed in the art a method by which the resistance of a polysilicon resistor of limited thickness and surface area may be increased without increasing the length of the resistor or decreasing the thickness of the resistor.

SUMMARY OF THE INVENTION

A first object of the present invention is to provide a polysilicon resistor within a semiconductor integrated circuit, which resistor possesses a higher resistance than conventional polysilicon resistors known in the art.

A second object of the present invention is to provide a polysilicon resistor in accord with the first object of the present invention, the dimensional area and thickness of which polysilicon resistor are to be consistent with advanced polysilicon resistors known in the art.

A third object of the present invention is to provide a polysilicon resistor in accord with the first and the second objects of the present invention, which resistor is readily manufacturable with currently available semiconductor fabrication equipment.

In accord with the objects of the present invention, a new polysilicon resistor and its method of fabrication are described. To form the polysilicon resistor, an insulating layer is first formed upon a semiconductor substrate. The insulating layer has a minimum of one aperture formed at least partially therethrough. Upon the insulating layer is deposited a polysilicon layer which is formed conformally into the aperture(s) formed into the insulating layer. A portion of the polysilicon layer which includes the portion of the polysilicon layer which is formed conformally into the aperture(s) forms the three dimensional polysilicon resistor of the present invention.

Polysilicon resistors formed through the method of the present invention exhibit resistances substantially in excess of the resistance of resistors of equivalent dimensions formed in absence of an underlying aperture into which the polysilicon resistor of the present invention is conformally formed.

Polysilicon resistors formed through the method of the present invention are readily manufacturable. The polysilicon resistor of the present invention is manufactured through the same method as conventional polysilicon resistors with the exception of the additional process steps which may be needed to form the aperture into the insulating layer underlying the polysilicon resistor of the present invention. In some semiconductor processing sequences no additional process steps will be needed to form the aperture into the insulating layer underlying the polysilicon resistor of the present invention. Although additional photolithographic and etching processes, when needed to form the aperture, will add manufacturing complexity to the method for forming polysilicon resistors of the present invention, the additional photolithographic and etching processes are well known in the art of semiconductor manufacturing.

BRIEF DESCRIPTION OF THE DRAWINGS

The accompanying drawings, which form a material part of this disclosure, show the following:

FIG. 1 shows a schematic cross-sectional diagram of a polysilicon resistor of the prior art.

FIG. 2a to FIG. 2d show schematic diagrams of the preferred embodiment of the three dimensional polysilicon resistor of the present invention.

DETAILED DESCRIPTION OF THE PREFERRED EMBODIMENT

The present invention differs significantly from conventional methods for forming polysilicon resistors within integrated circuit devices. The present invention provides a three dimensional polysilicon resistor which is formed conformally into a minimum of one aperture in an insulating layer underlying the polysilicon resistor. The polysilicon resistor so formed has a higher resistance than conventional polysilicon resistors of equivalent thickness and projected dimensional area. The higher resistance levels of polysilicon resistors of the present invention are desirable in advanced semiconductor integrated circuits which provide only limited surface area for resistors.

Within the three dimensional polysilicon resistor of the present invention, the polysilicon layer from which the resistor is formed is made three dimensional through forming the polysilicon layer conformally into a minimum of one aperture formed into an insulating layer which underlies the polysilicon layer. By forming a polysilicon resistor layer in this fashion, the sheet resistance of the polysilicon resistor layer is increased. The increased sheet resistance provides a polysilicon resistor of higher resistance than conventional polysilicon resistors of equivalent dimensions.

The polysilicon resistor of the present invention may be used in any integrated circuit where there is needed the high resistance achievable by the polysilicon resistor of the present invention within limited semiconductor substrate area. Resistors formed through the method of the present invention may be used in integrated circuits including but not limited to Dynamic Random Access Memory (DRAM) integrated circuits, Static Random Access Memory (SRAM) integrated circuits, bipolar transistor integrated circuits and field effect transistor integrated circuits.

Figure 2C:
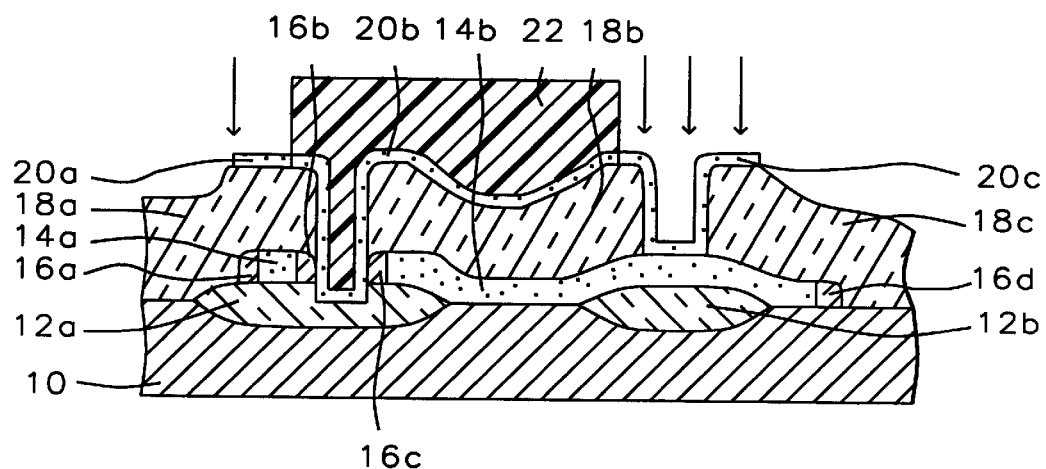
Figure 2D:
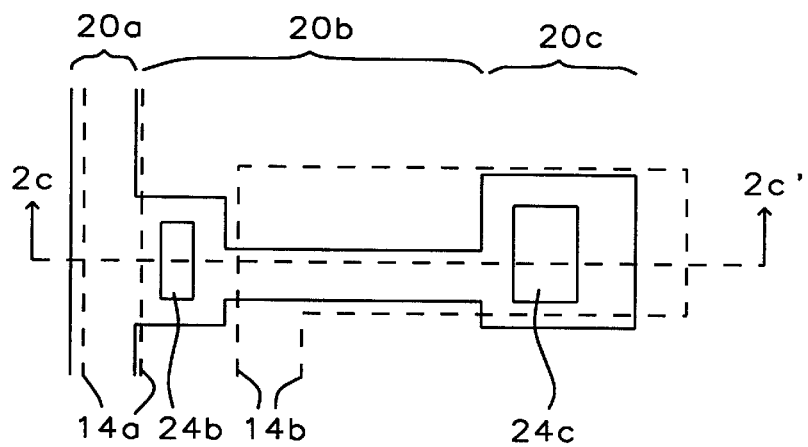

Referring now to FIG. 2a to FIG. 2c there is shown a series of schematic cross-sectional diagrams which illustrate the process steps by which the preferred embodiment of the three dimensional polysilicon resistor of the present invention is formed. FIG. 2d shows a plan-view schematic diagram illustrating the preferred embodiment of the three dimensional polysilicon resistor of the present invention after its final processing steps.

Referring to FIG. 2a, there is shown a schematic cross-sectional diagram of a semiconductor substrate illustrating the first series of process steps in accord with the preferred embodiment of the present invention. In FIG. 2a there is shown a semiconductor substrate 10 upon which has been formed field oxide isolation regions 12a and 12b. Although the present invention may be practiced upon semiconductor substrates of various dopant concentrations, either dopant polarity, and various crystallographic orientations, the semiconductor substrate 10 upon which the present invention is practiced will typically be a N– or P– silicon semiconductor substrate of (100) crystallographic orientation.

Processes by which field oxide isolation regions may be formed into and upon semiconductor substrates are well known in the art. Such processes include but are not limited to processes whereby portions of a semiconductor substrate exposed through a suitable oxidation mask are thermally oxidized to form field oxide isolation regions and processes whereby oxide materials are deposited upon the surface of a semiconductor substrate and patterned to form field oxide isolation regions. For the preferred embodiment of the present invention, the field oxide isolation regions 12a and 12b are preferably formed through a thermal oxidation process whereby portions of the semiconductor substrate 10 exposed through a suitable mask are oxidized.

Subsequent to forming field oxide isolation regions 12a and 12b, a blanket polysilicon layer is formed upon the surface of the semiconductor substrate 10 and patterned to form polysilicon layers 14a and 14b. There are several methods and materials by which blanket polysilicon layers may be formed upon semiconductor substrates. Blanket polysilicon layers may be formed through processes including but not limited to Chemical Vapor Deposition (CVD) processes and Plasma Enhanced Chemical Vapor Deposition (PECVD) processes. These processes may use as silicon precursor materials for the blanket polysilicon layers silane, disilane and silicon chloride. In addition, the blanket polysilicon layers may be made conductive by incorporation of dopant atoms during the process of forming the blanket polysilicon layers or by diffusion or ion implantation of dopant ions into blanket polysilicon layers previously formed upon a semiconductor substrate. Finally, blanket polysilicon layers may be patterned through methods including but not limited to wet chemical and dry plasma etching techniques.

For the preferred embodiment of the present invention, the blanket polysilicon layer from which are formed polysilicon layer 14a and polysilicon layer 14b is preferably formed through a Low Pressure Chemical Vapor Deposition (LPCVD) process employing silane as the silicon source material. The preferred thickness of the blanket polysilicon layer is about 1000 to about 3500 angstroms. Once the blanket polysilicon layer has been formed upon the semiconductor substrate 10, it is preferred to make the blanket polysilicon layer conductive through implanting the layer with phosphorus dopant ions at about 1E14 to about 1E16 ions per square centimeter dose and about 70 to about 100 keV ion implantation energy. Subsequent to ion implanting the blanket polysilicon layer, the blanket polysilicon layer is patterned into polysilicon layers 14a and 14b, preferably through photomasking the blanket polysilicon layer and etching the portions of the polysilicon exposed through the etch mask with a Reactive Ion Etch process employing chlorine and hydrogen bromide as the etchant gas composition.

Once the polysilicon layers 14a and 14b have been formed from the blanket polysilicon layer, the next step in the preferred embodiment of the present invention is to form insulating spacers 16a, 16b, 16c and 16d at the edges of the polysilicon layers 14a and 14b. These insulating spacers are formed in a fashion similar to the method by which the polysilicon layers 14a and 14b are formed. Specifically, a blanket layer of insulating material is formed upon the surface of the semiconductor substrate 10 and the polysilicon layers 14a and 14b. The blanket layer of insulating material is then etched without the presence of a photomask to leave remaining the insulating spacers 16a, 16b, 16c and 16d adjoining the edges of the polysilicon layers 14a and 14b.

There are several materials and methods through which blanket layers from which are formed insulating spacers may be formed. Such blanket layers may be formed of materials including but not limited to silicon oxides and silicon nitrides. Methods for forming blanket layers from such materials include but are not limited to Chemical Vapor Deposition (CVD) methods and Plasma Enhanced Chemical Vapor Deposition (PECVD) methods. Methods by which such blanket insulating layers are etched to form insulating spacers are also conventional in the art. Such methods are typically anisotropic Reactive Ion Etch (RIE) dry etch methods which employ an etchant gas appropriate to the insulating material to be etched.

For the preferred embodiment of the present invention, the insulating spacers 16a, 16b, 16c and 16d are preferably formed from a blanket insulating layer of silicon oxide material formed upon the semiconductor substrate 10 and the polysilicon layers 14a and 14b through a Low Pressure Chemical Vapor Deposition (LPCVD) process using Tetra Ethyl Ortho Silicate (TEOS) as the silicon source material. The blanket insulating layer is preferably formed upon the semiconductor substrate 10 at about 1000 to about 2500 angstroms thickness. After the blanket insulating layer is formed, the blanket insulating layer is etched through an anisotropic Reactive Ion Etch (RIE) dry etch process, employing carbon tetrafluoride and tri-fluoro methane as the etchant gas composition, to form the insulating spacers 16a, 16b, 16c and 16d.

Referring now to FIG. 2b, there is shown a cross-sectional schematic diagram illustrating the next series of process steps in accord with the preferred embodiment of the present invention. Shown in FIG. 2b is the presence of insulating layers 18a, 18b and 18c upon the surface of the semiconductor substrate 10 as illustrated in FIG. 2a. Analogously to the method by which the insulating spacers 16a, 16b, 16c and 16d were formed as illustrated in FIG. 2a, the insulating layers 18a, 18b and 18c are formed from a second blanket layer of insulating material that is deposited upon the surface of the semiconductor substrate 10 and subsequently patterned and etched through a photomask to yield insulating layers 18a, 18b and 18c. There are several materials from which the second blanket insulating layer from which are formed insulating layers 18a, 18b and 18c may be formed. Typical materials include silicon oxides and silicon nitrides.

For the preferred embodiment of the present invention, the second blanket insulating layer from which are formed insulating layers 18a, 18b and 18c is preferably formed from a silicon oxide material formed upon the surface of the semiconductor substrate 10 through a Low Pressure Chemical Vapor Deposition (LPCVD) process. The second blanket insulating layer is preferably formed at about 4000 to about 15000 angstroms thickness. The silicon oxide material from which is formed the second blanket insulating layer is patterned, using an appropriate photoresist as an etch mask, preferably through a Reactive Ion Etch (RIE) dry etching process employing carbon tetra-fluoride and tri-fluoro methane as the etchant gas composition. Resulting from this etching process are the insulating layers 18a, 18b and 18c. The insulating layers 18a, 18b and 18c have a thickness of about 4000 to about 15000 angstroms, an equivalent thickness to the thickness of the second blanket insulating layer from which they are formed.

From FIG. 2b it is seen that the aperture between insulating layers 18a and 18b is deeper that the aperture between insulating layers 18b and 18c. This differential in depth between these apertures results from the polysilicon layer 14b serving as an etch stop for the aperture between insulating layers 18b and 18c. The aperture between insulating layers 18a and 18b is formed upon the field oxide isolation region 12a which is also readily etched by the Reactive Ion Etch (RIE) etch process by which the aperture between the insulating layers 18a and 18b is formed. Thus, there is no effective etch stop for the aperture formed between insulating layers 18a and 18b. Typically, this aperture will be over-etched in depth into the field oxide isolation region 12a by about 500 to about 1000 angstroms.

The aperture between insulating layers 18a and 18b is the critical aperture for forming the three dimensional polysilicon resistor of the preferred embodiment of the present invention. Preferably, this aperture will be about 4000 to about 16000 angstroms in depth, including any over-etching into a substrate layer beneath the second blanket silicon oxide insulating layer into which the aperture is formed. Although the aperture may be formed with several cross-sectional geometric shapes, including but not limited to rectangles, squares and circles, the aperture will preferably have a rectangular cross-sectional shape with a minimum cross-sectional dimension of about 6000 angstroms in order to allow adequate conformality of the polysilicon layer subsequently formed into the aperture.

Referring now to FIG. 2c, there is shown a schematic cross-sectional diagram which illustrates the next series of process steps in accord with the preferred embodiment of the present invention. Shown in FIG. 2c is the presence of a second polysilicon layer upon the semiconductor substrate 10. The second polysilicon layer is formed from a second blanket polysilicon layer which has been patterned and etched to leave remaining the adjoining second polysilicon layers 20a, 20b and 20c. The second polysilicon layer 20b is formed in part conformally into the aperture between insulating layers 18a and 18b. Second polysilicon layer 20b comprises the three dimensional polysilicon resistor of the present invention. It is critical to the present invention that the second polysilicon layer 20b be formed conformally into the aperture between insulating layers 18a and 18b. If the second polysilicon layer 20b fills this aperture completely the desired high resistance characteristics will not be exhibited by the three dimensional polysilicon resistor of the present invention.

At the bottom of the aperture between insulating layer 18b and insulating layer 18c, second polysilicon layer 20c forms a stacked contact with the polysilicon layer 14b. Second polysilicon layer 20a forms an interconnecting element through which second polysilicon layer 20b is connected to other portions of the integrated circuit formed upon semiconductor substrate 10.

The second blanket polysilicon layer from which are formed second polysilicon layers 20a, 20b and 20c is formed through a process similar to the process used in forming the blanket polysilicon layer from which polysilicon layers 14a and 14b are formed. Specifically, the second blanket polysilicon layer from which second polysilicon layers 20a, 20b and 20c are formed is formed upon the semiconductor substrate 10 through a Low Pressure Chemical Vapor Deposition (LPCVD) process employing silane as the silicon source material. The preferred thickness of the second blanket polysilicon layer, which corresponds to the thickness of the second polysilicon layers 20a, 20b and 20c, is from about 300 to about 1000 angstroms. At this thickness, the second polysilicon layer 20b which forms the polysilicon resistor of the present invention will occupy no more than about 30 percent of the width of the aperture between insulating layers 18a and 18b into which the second polysilicon layer 20b is formed. Optionally, the second blanket polysilicon layer from which is formed second polysilicon layers 20a, 20b and 20c may be lightly doped with dopant species including but not limited to arsenic atoms, boron atoms and phosphorus atoms.

After the second blanket polysilicon layer is formed upon the semiconductor substrate 10, it is patterned to leave remaining only polysilicon layers 20a, 20b and 20c. Subsequent to this patterning of the second blanket polysilicon layer, an additional blanket photoresist layer is formed upon the surface of the semiconductor substrate 10 and patterned to leave remaining photoresist layer 22 which covers second polysilicon layer 20b. Once second polysilicon layer 20b has been covered by photoresist layer 22, second polysilicon layers 20a and 20c are preferably made conductive through high dose implanting with dopant ions.

The process through which polysilicon may be made conductive through implantation with high doses of dopant ions is well known in the art. Polysilicon may be implanted with dopant ions including but not limited to arsenic ions, boron ions and phosphorus ions. For the preferred embodiment of the present invention, the second polysilicon layers 20a and 20c are made conductive through ion implantation employing phosphorus dopant ions at about 1E14 to about 1E16 ions per square centimeter dose and about 25 to about 40 keV ion implantation energy. As a result of this ion implantation process, second polysilicon layers 20a and 20c form conductive ends to second polysilicon layer 20b, which second polysilicon layer 20b forms the three dimensional resistor of the present invention.

Referring now to FIG. 2d, there is shown a plan-view schematic diagram corresponding to the cross-sectional schematic diagram of FIG. 2c after the photoresist layer 22 has been removed from the surface of the semiconductor substrate 10. Shown in FIG. 2d is the three dimensional resistor of the present invention which is formed from second polysilicon layer 20b. Adjoining second polysilicon layer 20b are second polysilicon layer 20a which provides a connecting element to other portions of the electrical circuit to which the resistor of the present invention is connected, and second polysilicon layer 20c which provides a connection to underlying polysilicon layer 14b.

The aperture 24b within second polysilicon layer 20b forms the three dimensional portion of the resistor of the present invention, which resistor provides a higher resistance than is conventional in the art. The aperture or via 24c within second polysilicon layer 20c provides contact between the high resistance polysilicon resistor of the present invention and the underlying polysilicon layer 14b. The perimeters of the polysilicon layers 14a and 14b which reside beneath the second polysilicon layers 20a, 20b and 20c are shown as the dashed lines 14a and 14b.

EXAMPLE 1

Upon a semiconductor substrate wafer was formed a field oxide layer of thickness of about 3500 angstroms. Upon the field oxide was formed a blanket polysilicon layer of thickness of about 560 angstroms. The blanket polysilicon layer was formed upon the field oxide layer through a Low Pressure Chemical Vapor Deposition (LPCVD) process employing silane as the silicon source gas. The blanket polysilicon layer was subsequently patterned to yield a series of polysilicon lines on the surface of the field oxide. The polysilicon lines were about 1 micron in width and about 100 microns in length. The polysilicon lines were then doped through ion implantation with phosphorus ions at about 3E15 ions per square centimeter ion implantation dose and about 30 keV ion implantation energy. Finally, the semiconductor substrate wafer having the doped polysilicon lines upon its surface was passivated with a silicon oxide insulating layer formed through a Plasma Enhanced Chemical Vapor Deposition (PECVD) process employing Tetra Ethyl Ortho Silicate (TEOS) as the silicon source material and a doped glass insulating layer formed through a Chemical Vapor Deposition (CVD) process employing Tetra Ethyl Ortho Silicate (TEOS) along with appropriate boron and phosphorus dopants. The passivating layers had openings etched therethrough to access opposite ends of the doped polysilicon lines. The resistances of the individual lines was measured. The measured resistance values were normalized to the width and length of the polysilicon lines. The normalized resistance value so calculated are reported in TABLE I.

EXAMPLE 2

A second semiconductor substrate wafer was prepared in a fashion similar to the semiconductor substrate wafer described in EXAMPLE 1. Specifically, a field oxide layer of thickness 3500 angstroms was formed upon the surface of the second semiconductor substrate wafer. Upon the field oxide was then formed a test structure whose cross-section corresponds to the cross-sectional schematic diagram of FIG. 3a.

Figure 3A:
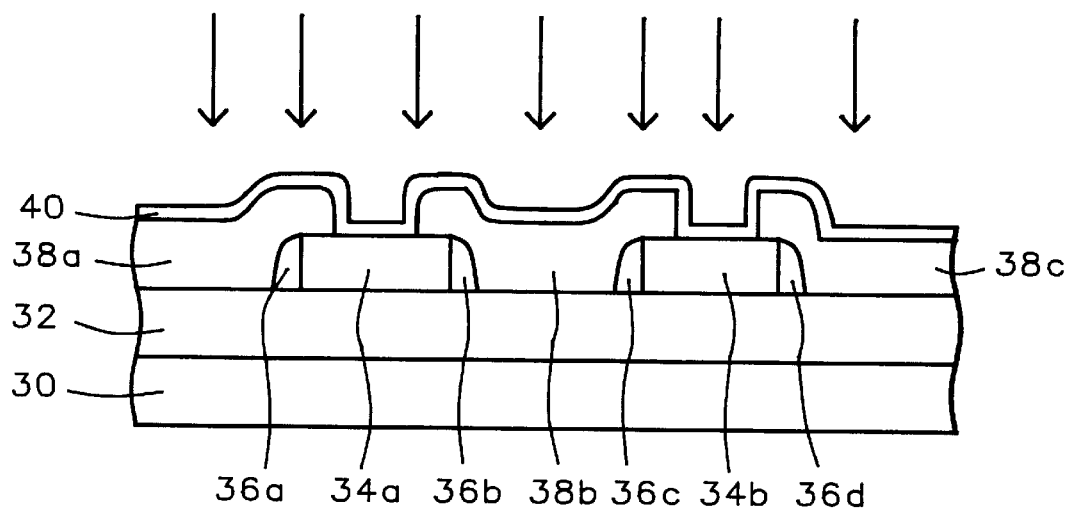
FIG. 3a and FIG. 3b show schematic diagrams of a resistor test structure formed in accord with the principles of the present invention.

Within FIG. 3a there is shown the semiconductor substrate 30 upon which was formed the field oxide layer 32. Upon the field oxide layer 32 was formed discrete polysilicon pads 34a and 34b which had at their edges insulator spacers 36a, 36b, 36c and 36d. The polysilicon pads 34a and 34b were about 3000 angstroms thick and they are about one micron in width by about one micron in length. The polysilicon pads 34a and 34b were formed through patterning and etching of a blanket phosphorus doped polysilicon layer formed upon the surface of the field oxide layer 32 through a Low Pressure Chemical Vapor Deposition (LPCVD) process using silane as the silicon source material. The insulating spacers 36a, 36b, 36c and 36d were formed through a process similar to the process described in the preferred embodiment of the present invention. Specifically, the insulating spacers 36a, 36b, 36c and 36d were formed through unmasked etching of a blanket layer of insulating material that was formed upon the surface of the field oxide layer 32 and the polysilicon pads 34a and 34b. The blanket layer of insulating material from which was formed the insulating spacers was formed through a Low Pressure Chemical Vapor Deposition (LPCVD) process employing Tetra Ethyl Ortho Silicate (TEOS) as the silicon source material. The blanket layer of insulating material was formed at about 2000 angstroms thickness.

Upon the surface of the field oxide layer 32, the insulating spacers 36a, 36b, 36c and 36d, and the polysilicon pads 34a and 34b was then formed a blanket oxide layer which was patterned to form oxide layers 38a, 38b and 38c. The blanket oxide layer from which was formed oxide layers 38a, 38b and 38c was formed through a Low Pressure Chemical Vapor Deposition (LPCVD) process employing Tetra Ethyl Ortho Silicate (TEOS) as the silicon source material. The blanket oxide layer was approximately 5000 angstroms thick. Apertures were then etched through the blanket oxide layer, simultaneously reaching the polysilicon pads 34a and 34b and forming the oxide layers 38a, 38b and 38c. The apertures had dimensions of about 0.6 micron by 0.6 micron with a step depth of about 5000 angstroms corresponding to the thickness of the blanket oxide layer from which was formed oxide layers 38a, 38b and 38c. A blanket polysilicon layer 40 of thickness about 500 angstroms was then formed over the surface of the insulating layers 38a, 38b and 38c and into the apertures between adjoining insulating layers to make contact with the polysilicon pads 34a and 34b.

Figure 3B:
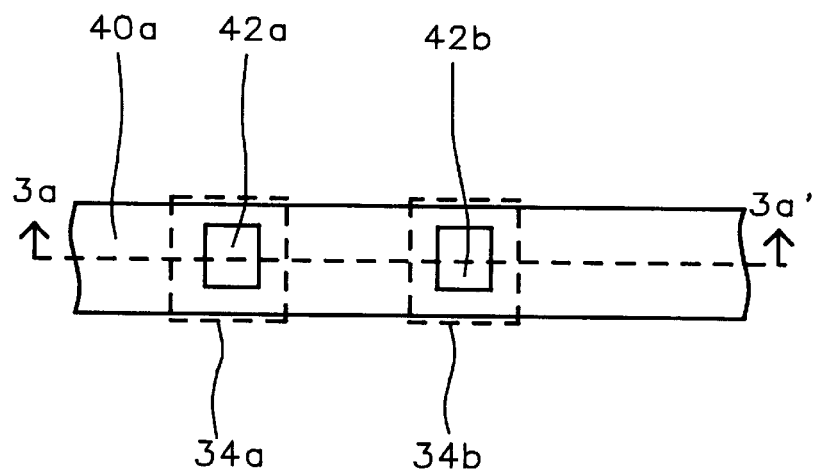

Similarly to EXAMPLE 1, the blanket polysilicon layer 40 was patterned to form a series of polysilicon lines of width approximately 1 micron. The polysilicon lines were aligned over the polysilicon pads 34a and 34b. Analogously to EXAMPLE 1, the polysilicon lines were then ion implanted with phosphorus ion at about 3E15 ions per square centimeter dose and about 30 keV ion implantation energy. A plan-view schematic diagram of the semiconductor substrate at this point in its processing is shown in FIG. 3b. Shown in FIG. 3b is a polysilicon line 40a formed over polysilicon pads 34a and 34b. Contact is made between the polysilicon line 40a and the polysilicon pads 34a and 34b through apertures 42a and 42b, respectively.

As a final process step, the polysilicon lines 40a were passivated with a silicon oxide insulating layer formed from a Plasma Enhanced Chemical Vapor Deposition (PECVD) process employing Tetra Ethyl Ortho Silicate (TEOS) as the silicon source material and a doped glass insulating layer formed through a Chemical Vapor Deposition (CVD) process employing Tetra Ethyl Ortho Silicate (TEOS) as the silicon source materials along with appropriate boron and phosphorus dopants. The passivating layers had openings etched therethrough to access opposite ends of the doped polysilicon line 40a and adjoining doped polysilicon lines which were formed into the three dimensional test structure. The resistances of these polysilicon lines were then determined by measuring the resistance of individual lines and normalizing the observed resistance values to the length and width of the individual lines. The resistance value calculated in this fashion is reported in TABLE I.

TABLE I

| EXAMPLE | PROCESS CONDITIONS | RESISTANCE |
| --- | --- | --- |
| 1 | flat polysilicon layer | 206 ohms/sq |
| 2 | three dimensional polysilicon layer | 1650 ohms/sq |

From the data of TABLE I it is seen that under approximately equivalent process conditions, a three dimensional polysilicon resistor formed in accord with the method described in EXAMPLE 2 has a substantially higher resistance than a flat polysilicon resistor of comparable dimensions formed through the method of EXAMPLE 1. Such higher resistance resistors are useful within semiconductor substrates providing limited surface area for resistor structures. Such resistors may also provide a novel method to vary resistance of resistors within integrated circuits.

What is claimed is:

1. A method for forming a polysilicon resistor for use in integrated circuits comprising:

providing a semiconductor substrate;

forming over the semiconductor substrate a conductor layer;

forming over the conductor layer an insulating layer, the insulating layer having an aperture formed partially through the insulating layer, the aperture being bounded by insulating layer, the insulating layer also having a via formed through the insulating layer, the via accessing the conductor layer;

forming upon the insulating layer a polysilicon layer, the polysilicon layer being formed conformally into the aperture and conformally into the via without filling the aperture; and patterning the polysilicon layer to form a polysilicon resistor and a pair of polysilicon electrode ends contiguous with the polysilicon resistor, where the polysilicon resistor includes a portion of the polysilicon layer formed conformally into the aperture within the insulating layer and where a polysilicon electrode end within the pair of polysilicon electrode ends includes a portion of the polysilicon layer(s) formed conformally into the via and contacting the conductor layer.

2. The method of claim 1 wherein the insulating layer is formed from silicon oxide.

3. The method of claim 2 wherein the thickness of the insulating layer is about 4000 to about 15000 angstroms.

4. The method of claim 1 wherein the depth of the aperture(s) into which is formed the polysilicon layer is about 4000 to about 16000 angstroms.

5. The method of claim 1 wherein the minimum cross-sectional dimension of the aperture(s) into which is formed the polysilicon layer is about 6000 angstroms.

6. The method of claim 1 wherein the thickness of the polysilicon layer is about 300 to about 1000 angstroms.

7. The method of claim 6 wherein the polysilicon layer is formed through a Low Pressure Chemical Vapor Deposition (LPCVD) process employing silane as the silicon source material.

8. The method of claim 1 wherein each polysilicon electrode end within the pair of polysilicon electrode ends is formed through ion implanting the polysilicon electrode end with a dopant ion chosen from the group of dopant ions consisting of arsenic dopant ion, phosphorus dopant ion and boron dopant ion.

9. The method of claim 8 it wherein the dopant ion is phosphorus dopant ion.

10. The method of claim 9 where the phosphorus dopant ion is implanted at about 1E14 to about 1E16 ions per square centimeter ion implantation dose and about 25 to about 40 keV ion implantation energy.

11. A polysilicon resistor for use in integrated circuits comprising:
   a semiconductor substrate;
   a conductor layer formed over the semiconductor substrate;
   an insulating layer formed over the conductor layer, the insulating layer having an aperture formed partially through the insulating layer, where the aperture is bounded by the insulating layer the insulating layer also having formed therethrough a via accessing the conductor layer; and
   a patterned polysilicon layer formed upon the insulating layer, the patterned polysilicon layer being formed conformally into the aperture and conformally into the via without filling the aperture, the patterned polysilicon layer forming a polysilicon resistor and a pair of polysilicon electrode ends contiguous with the polysilicon resistor, where the polysilicon resistor includes a portion of the polysilicon layer formed conformally into the aperture within the insulating layer and where a polysilicon electrode end within the pair of polysilicon electrode ends includes a portion of the polysilicon layer formed within the via and contacting the conductor layer.

12. The polysilicon resistor of claim 11 wherein the insulating layer is formed from a silicon oxide and the insulating layer is about 4000 to about 15000 angstroms thick.

13. The polysilicon resistor of claim 11 wherein the depth of the aperture(s) into which the polysilicon layer is formed is about 4000 to about 16000 angstroms in depth and the minimum cross-sectional dimension of the aperture(s) into which the polysilicon layer is formed is about 6000 angstroms.

14. The polysilicon resistor of claim 11 wherein the polysilicon layer is about 300 to about 1000 angstroms thick.

15. The polysilicon resistor of claim 11 wherein each polysilicon electrode end within the pair of polysilicon electrode ends is implanted with phosphorus dopant ions at about 1E14 to about 1E16 ions per square centimeter dose and about 25 to about 40 keV ion implantation energy.

* * * * *